(12) United States Patent
Ball

(10) Patent No.: US 7,046,494 B2
(45) Date of Patent: May 16, 2006

(54) PROTECTION CIRCUIT FOR A POWER SWITCHING DEVICE

(75) Inventor: Stuart R. Ball, Yukon, OK (US)

(73) Assignee: Seagate Technology LLC, Scotts Valley, CA (US)

( * ) Notice: Subject to any disclaimer, the term of this patent is extended or adjusted under 35 U.S.C. 154(b) by 313 days.

(21) Appl. No.: 10/455,475

(22) Filed: Jun. 5, 2003

(65) Prior Publication Data

US 2004/0246642 A1    Dec. 9, 2004

(51) Int. Cl.
*H02H 3/00* (2006.01)
(52) U.S. Cl. .................................... 361/93.1
(58) Field of Classification Search ........... 361/93.1
See application file for complete search history.

(56) References Cited

U.S. PATENT DOCUMENTS

| | | | |
|---|---|---|---|
| 4,553,084 A | 11/1985 | Wrathall | |
| 5,504,448 A | 4/1996 | Bennett et al. | |
| 5,579,193 A | 11/1996 | Schmidt et al. | |
| 5,737,169 A | 4/1998 | Sellers | |
| 5,793,589 A | 8/1998 | Friedl | |
| 5,861,737 A * | 1/1999 | Goerke et al. | 323/282 |
| 6,137,668 A | 10/2000 | Feldtkeller | |
| 6,169,439 B1 | 1/2001 | Teggatz et al. | |
| 6,218,888 B1 | 4/2001 | Otsuki | |
| 6,225,797 B1 | 5/2001 | Willis et al. | |
| 6,269,011 B1 * | 7/2001 | Ohshima | 363/50 |
| 6,285,177 B1 | 9/2001 | Mallikarjunaswamy et al. | |
| 6,381,152 B1 | 4/2002 | Takahashi et al. | |
| 6,400,163 B1 * | 6/2002 | Melcher et al. | 324/713 |
| 6,420,832 B1 | 7/2002 | Rabine | |
| 6,466,422 B1 | 10/2002 | Luo | |

* cited by examiner

Primary Examiner—Stephen W. Jackson
(74) Attorney, Agent, or Firm—Fellers, Snider, et al.

(57) ABSTRACT

A protection circuit for a power switching device of the type configured to supply load current to an electrical load from a voltage source. The protection circuit includes a voltage drop sensing circuit connected in parallel with the switching device to sense a voltage drop across the switching device. A limit circuit is connected to the voltage drop sensing circuit and operates to inhibit further flow of load current through the switching device in relation to the sensed voltage drop. The limit circuit limits the load current to different maximum values for different sensed voltage drop values. This enables the load current to be limited to a lower value in the event an electrical short occurs across the load, reducing the amount of power dissipated by the switching device.

20 Claims, 3 Drawing Sheets

US 7,046,494 B2

PROTECTION CIRCUIT FOR A POWER SWITCHING DEVICE

RELATED APPLICATION

This application claims domestic priority under 35 U.S.C. § 119(e) to United States Provisional Application No. 60/404,724 filed Aug. 20, 2002.

FIELD OF THE INVENTION

This invention relates generally to the field of electrical power circuits and more particularly, but not by way of limitation, to a protection circuit which provides current limiting for a power switching device, such as a field effect transistor (FET).

BACKGROUND

It is common for modern electronic circuits to use a switching device such as a power field effect transistor (FET) to control the application of current to an electrical load. The switching device is typically arranged in series between a voltage source and the load so that, when an appropriate voltage is applied to a gate terminal, a source-to-drain conduction path is established through the device which allows current to flow to the load.

It is generally desirable to protect a switching device against overloading in order to prevent damage to the device as a result of excessive heat dissipation and other effects. Particularly, if an electrical short occurs in the load, virtually all of the supply voltage is provided across the switching device at substantially all of the available current that can be supplied by the voltage source.

Accordingly, there is a continued need for improvements in the art to provide current limit protection for switching devices, and it is to such improvements that the present invention is directed.

SUMMARY OF THE INVENTION

As embodied herein and as claimed below, the present invention is generally directed to a protection circuit for a power switching device.

The switching device has respective source, drain and gate terminals. The switching device is configured to supply current to a load from a voltage source along a source-to-drain path in relation to an input signal provided to the gate terminal.

The protection circuit includes a voltage drop sensing circuit connected in parallel with the switching device to sense a source-to-drain voltage drop across the switching device. The protection circuit further includes a limit circuit connected to the voltage drop sensing circuit which operates to inhibit further flow of source-to-drain current through the switching device in relation to the sensed source-to-drain voltage drop.

The limit circuit limits the source-to-drain current to different maximum values for different sensed source-to-drain voltage drop values. In this way, a lower current limit value is utilized in the event of an electrical short across the load, thereby reducing the amount of power dissipated in the device before the device is turned off.

These and various other features and advantages which characterize the claimed invention will be apparent from a reading of the following detailed description and a review of the associated drawings.

DETAILED DESCRIPTION

Figure 1:
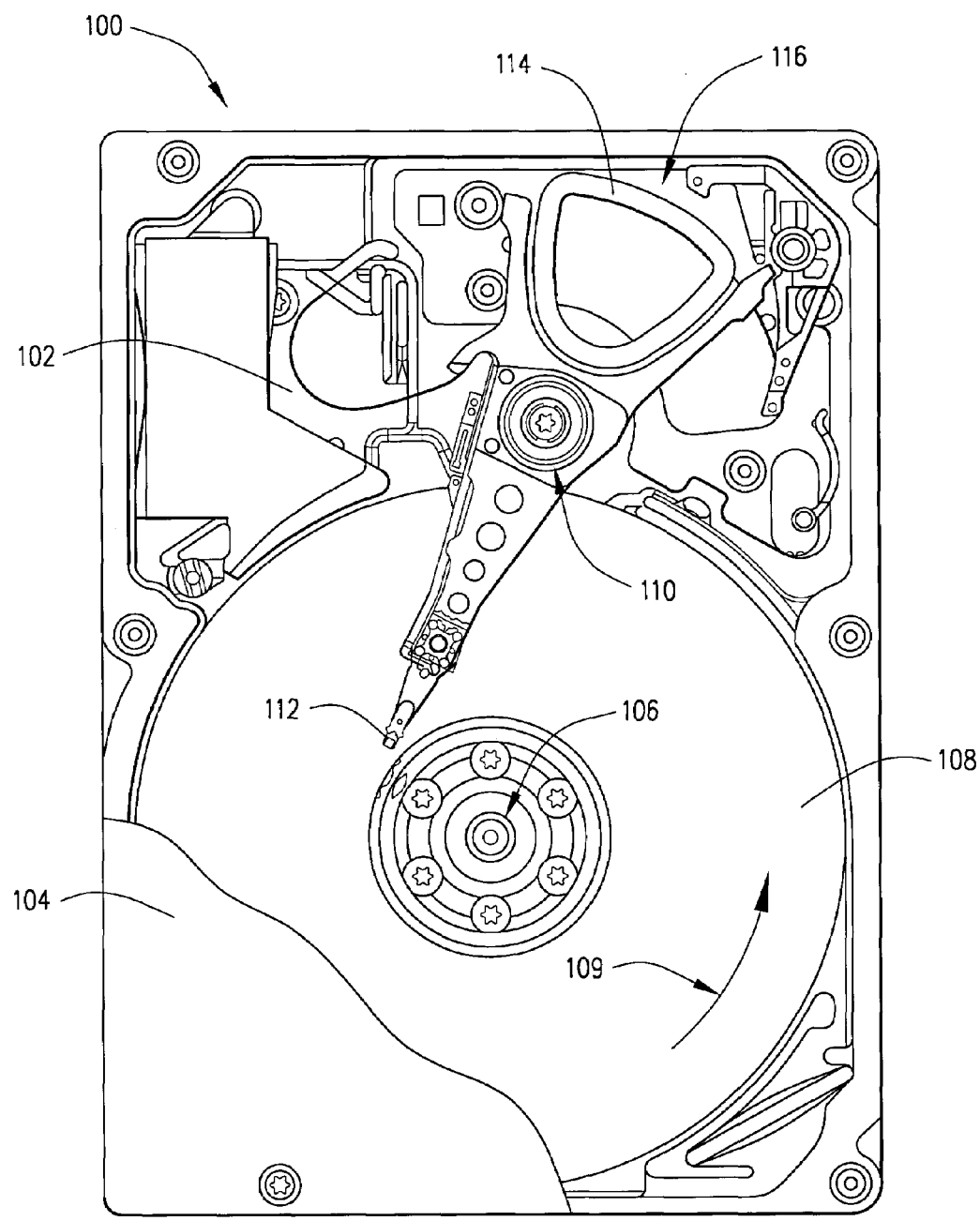
FIG. 1 is a top plan view of a disc drive data storage device constructed and operated in accordance with preferred embodiments of the present invention.

To provide an exemplary environment in which preferred embodiments of the present invention can be advantageously practiced, FIG. 1 shows a disc drive data storage device 100 configured to store and retrieve digital data. A base deck 102 cooperates with a top cover 104 (shown in partial cutaway) to form an environmentally controlled housing for the device 100.

A spindle motor 106 supported within the housing rotates a number of rigid magnetic recording discs 108 in a rotational direction 109. An actuator 110 is provided adjacent the discs 108 and moves a corresponding number of heads 112 across the disc recording surfaces through application of current to an actuator coil 114 of a voice coil motor (VCM) 116. Communication and control electronics for the disc drive 100 are provided on a disc drive printed circuit board (PCB) mounted to the underside of the base deck 102.

The various electronic circuits of the device 100, the spindle motor 106, and the VCM 116 represent electrical loads of the device 100. These and other types of electrical loads can be serviced using one more switching devices that are protected in accordance with preferred embodiments of the present invention, as discussed below.

Figure 2:
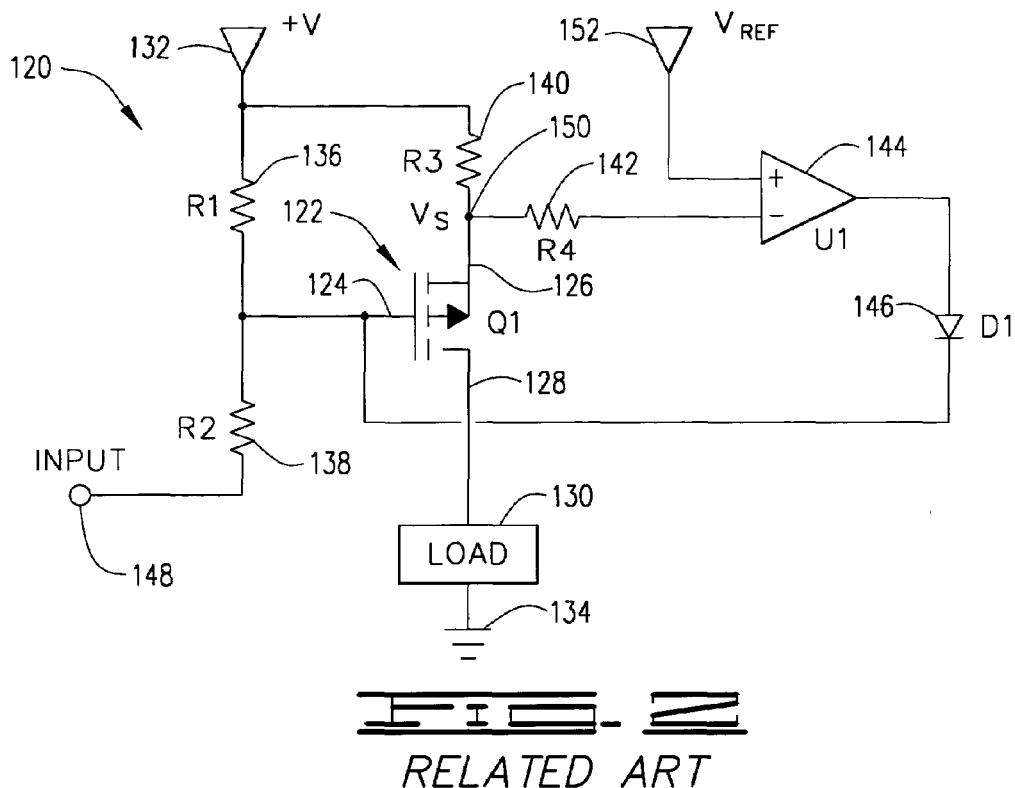
FIG. 2 shows a circuit block diagram for a protection circuit from the related art used to protect a switching device from an overloading condition.

At this point it may be helpful to briefly discuss a related art protection circuit, such as shown at 120 in FIG. 2. The protection circuit 120 provides current limit protection for a switching device (Q1) 122. The device 122 is preferably characterized as a p-channel power field effect transformer (FET) with respective gate, source and drain terminals (nodes) 124, 126 and 128.

The switching device 122 is used to controllably allow current to flow to a load 130 from a voltage source 132 to a reference line (ground) 134. The current flows through the device 122 along a source-to-drain path through appropriate biasing of the gate terminal 124. While FIG. 2 shows the load 130 being serviced with a positive voltage (+V) with respect to ground, it will be readily understood that the circuit 120 can also be configured to supply a negative voltage to the load.

The protection circuit includes R1–R4 resistors 136, 138, 140 and 142, a operational amplifier (U1) 144, a diode (D1) 146 and an INPUT terminal 148. The voltage state (high or low) of the INPUT terminal 148 controls the source-to-drain conductivity of the switching device 122. When the INPUT terminal 148 goes low, the voltage at the gate terminal 124 is pulled low and the switching device 122 turns on, permitting current flow to the load 130.

The R3 resistor 140 develops a sense voltage $V_S$ at node 150 proportional to the current flowing through the switching device 122. The voltage $V_S$ is provided to the negative input terminal of the operational amplifier (opamp) 144. A reference voltage $V_{REF}$ from a reference voltage source 152 is provided to the positive input terminal of the opamp 144. The reference voltage $V_{REF}$ is preferably maintained at a level just below the source voltage V+.

When the magnitude of the voltage $V_S$ exceeds the reference voltage $V_{REF}$, the output of the opamp 144 remains saturated at or near ground. Thus, the gate terminal voltage remains at the level established by the INPUT terminal and the switching device 122 remains conductive along the source-to-drain path. As the current through the switching device 122 increases, the voltage $V_S$ will decrease. Eventually, when the load current is high enough so that $V_S$ falls below $V_{REF}$, the output of the opamp 144 will go high, pulling the gate terminal 124 high and turning off the switching device 122.

While operable, limitations with this and other types of detection circuits include the fact that the maximum current limit value (i.e., the magnitude of current through the switching device 122 beyond which the device is turned off by the opamp 144) is independent of the voltage across the device. Thus, an electrically shorted load will tend to cause the device 122 to dissipate power at a value substantially equal to the maximum current limit value times the full supply voltage. Even if such dissipation takes place for a short time before the device 122 is turned off, the resulting voltage and current levels can be sufficient to induce damage in the device.

Figure 3:
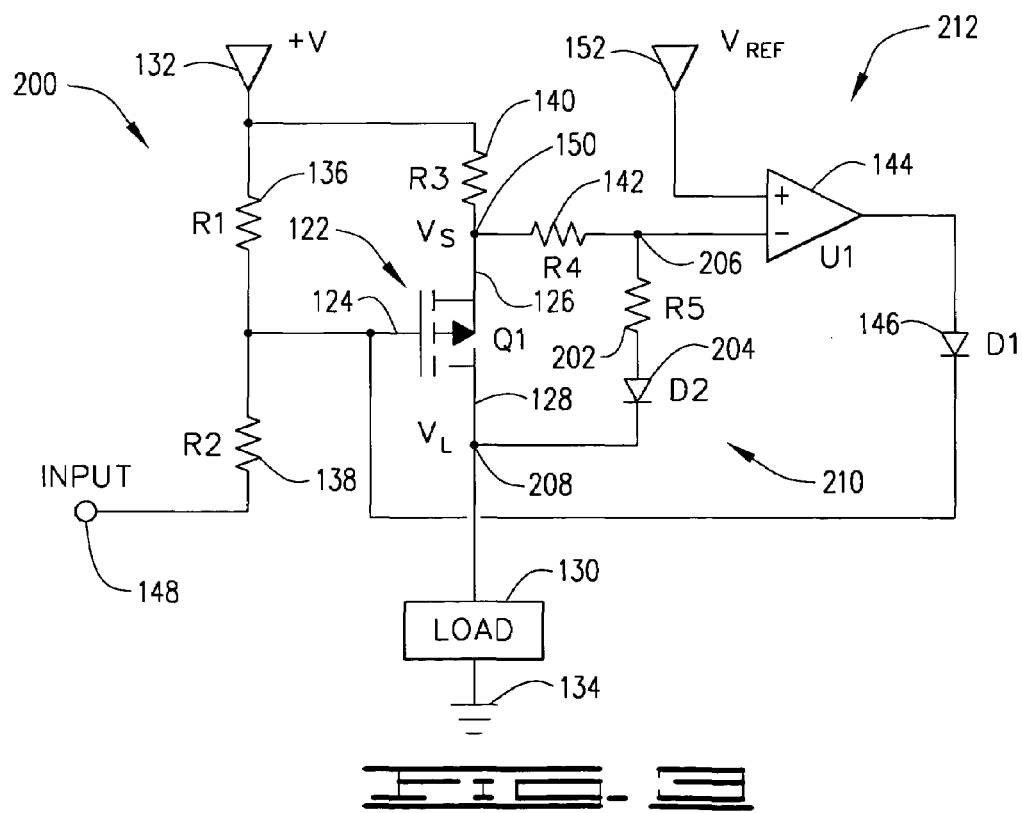
FIG. 3 provides a circuit block diagram for a protection circuit constructed and operated in accordance with a preferred embodiment to protect a switching device from an overloading condition.

Accordingly, FIG. 3 provides a circuit block diagram for a protection circuit 200 constructed and operated in accordance with a preferred embodiment of the present invention to overcome such limitations. Like reference numerals are used in FIGS. 2 and 3 for same or similar components in the respective circuits.

The circuit 200 in FIG. 3 is shown to further include an R5 resistor 202 and a second diode (D2) 204. A terminal of the R5 resistor 202 is connected to a sense node 206 between the R4 resistor 142 and the opamp 144, and a terminal of the D2 diode 204 is connected to the drain terminal 128 ($V_L$ node 208 between the switching device 122 and the load 130).

For reference, a voltage drop sensing circuit 210 preferably comprises at least the R4 and R5 resistors 142, 202 and the D2 diode 204. The voltage drop sensing circuit 210 is connected in parallel with the switching device 122 to sense a source-to-drain voltage drop across the switching device 122.

A current limit circuit 212 preferably comprises at least the opamp 144 and the D1 diode 146. The current limit circuit 212 operates to inhibit further source-to-drain current through the switching device in relation to the sensed source-to-drain voltage drop provided by the voltage drop sensing circuit 210.

As shown in FIG. 3, the voltage at the negative input of the opamp 144 will be determined in relation to the voltage divider effects produced by the R4 and R5 resistors 142, 202 and the diode 204. If the load 130 is electrically shorted, the voltage across the load 130 ($V_L$) will remain at or near ground, and the load current required to bring the opamp 144 out of saturation is lower than that required by FIG. 2. This is because the voltage at the negative input of the opamp 144 will be higher in FIG. 3 as compared to FIG. 2 as a result of the additional path through R5 resistor 202 and D2 diode 204.

As the voltage across the load 130 increases, the load current required to bring the opamp 144 out of saturation becomes higher. If the switching device 122 is able to fully saturate, the voltage drop across the device 122 will be less than the forward conduction voltage of the D2 diode, and the limiting current will be at a maximum value.

In this way, the protection circuit 200 advantageously operates to limit the source-to-drain current through the switching device 122 to different maximum values for different sensed source-to-drain voltage drop values. The current is limited to lower values when the voltage across the load ($V_L$) is lower (indicating greater amounts of current are flowing through the device 122 such as in the event of an electrical short or near short condition across the load). Thus, the amount of power dissipated by the device 122 in the event of an electrical short across the load 130 is substantially reduced.

Contrawise, the higher the voltage the switching device 122 is able to apply to the load 130, the higher the current limit value will be until a maximum value is reached. This allows the circuit 200 to accommodate widely varying load currents (such as in the motors 106, 116) and not interfere with normal operation of the load while at the same time providing robust overcurrent protection for the device 122.

Figure 4:
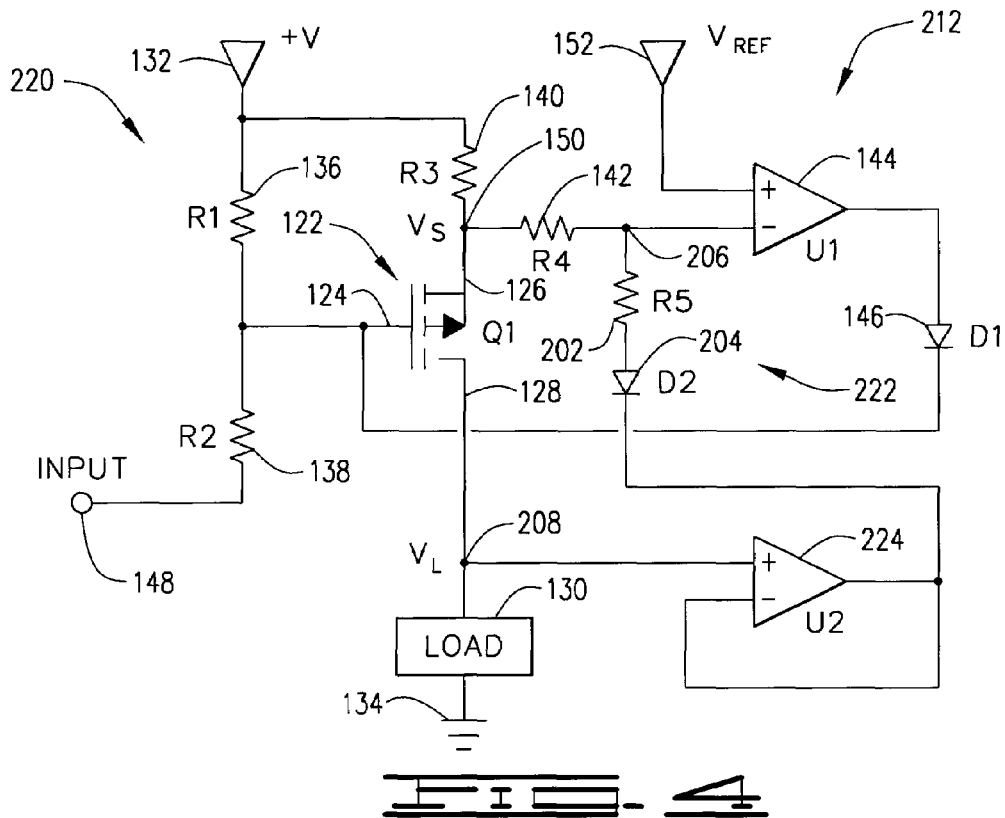
FIG. 4 provides a circuit block diagram for a protection circuit constructed in accordance with another preferred embodiment.

Continuing with a review of FIG. 3, it will be noted that even if the switching device 122 is turned off, the circuit 200 still supplies a relatively small amount of current to the load 130 through the current path established by the R5 resistor 202 and the D2 diode 204. In many applications this may not present a problem. However, FIG. 4 provides an alternative protection circuit 220 in which no load current flows when the switching device 122 is turned off. As before, like reference numerals are used in FIG. 4 for same or similar components in FIGS. 2 and 3.

The protection circuit 220 in FIG. 4 includes a voltage drop sensing circuit 222 that includes the aforedescribed R4 and R5 resistors 142, 202 and D2 diode 204, as well as a second opamp (U2) 224. The positive input to the opamp 224 is connected to the $V_L$ node 208 and the negative input, as well as the output of the opamp 224 are connected to the D2 diode 204.

As before, the voltage drop sensing circuit 222 generally operates to sense the voltage drop across the switching device 122 and limit the current through the device 122 accordingly. The second opamp 224 further prevents the flow of current through the load 130 when the switching device 122 is turned off.

Figure 5:
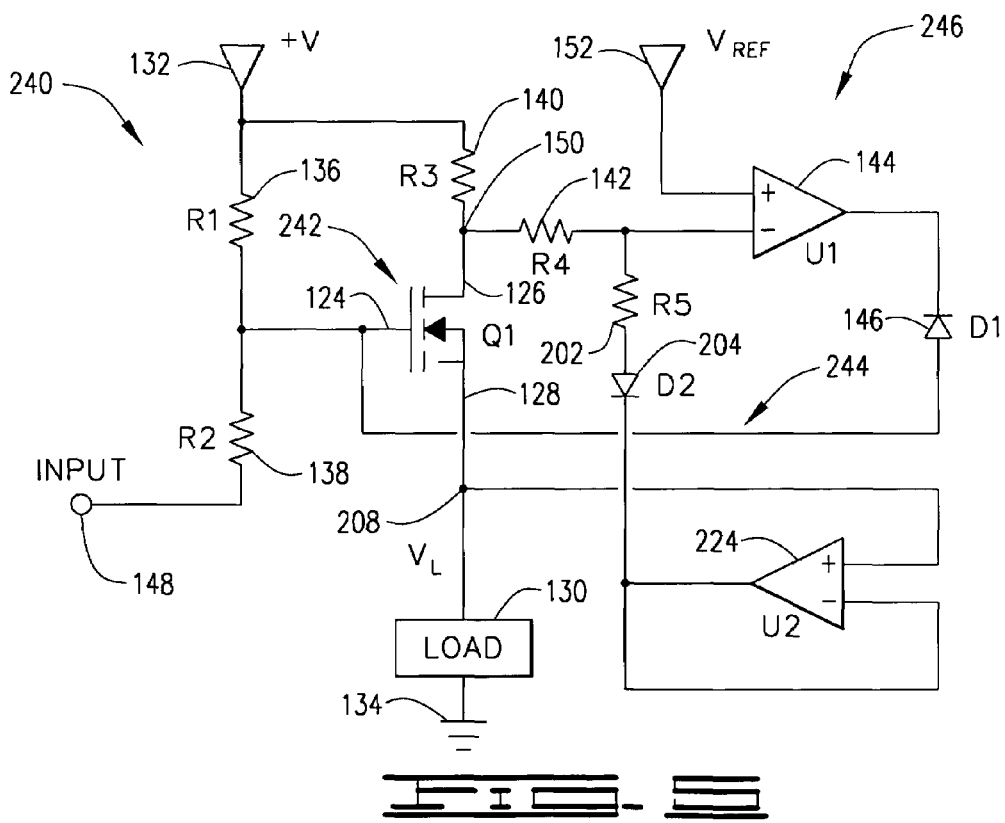
FIG. 5 provides a circuit block diagram for a protection circuit constructed in accordance with yet another preferred embodiment.

FIG. 5 provides yet another protection circuit 240. Like reference numerals in FIG. 5 are used for same or similar components in FIGS. 2–4.

The protection circuit 240 operates to protect a switching device 242 which is preferably characterized as an n-channel power FET. Unlike the p-channel devices 122 in FIGS. 2–4, the n-channel device 242 in FIG. 5 supplies load current along a source-to-drain path when the gate terminal 122 is pulled low by the INPUT terminal 148.

The protection circuit 240 includes a voltage drop sensing circuit 244 generally similar to the sensing circuit 222 in FIG. 4, except for the connection orientation of the second opamp 224 as shown. The protection circuit 240 further includes a current limit circuit 246 generally similar to the limit circuit 212 in FIGS. 3 and 4, except that the positive and negative input connections for the first opamp 144 and the D1 diode 146 are reversed in FIG. 5 as compared to the orientations shown in FIGS. 3 and 4. The circuit 240 operates as discussed above to provide different current limit values for different voltages across the load 130.

For each of the foregoing protection circuits 200, 220 and 240, the voltage at the sense node 206 (i.e., the voltage provided as a reference input to the first opamp 144) is approximated by the following relation:

$$\frac{V_S - (V_L + 0.6) \times R5}{R4 + R5} + V_L + 0.6 \quad (1)$$

where $V_L$ is the voltage from the load 130 to ground 152, $V_S$ is the voltage at node 150 and 0.6 is the approximate diode forward conduction voltage.

The maximum limit current available will generally be equal to:

$$\frac{((V+) - V_{REF})}{R3} \quad (2)$$

where V+ is the source voltage from source 132, VREF is the reference voltage from source 152 and R3 is the resistance of R3 resistor 140.

It will be readily apparent that other types of active and passive devices can be used in the respective voltage drop sensing circuits 210, 222, 244 and the current limiting circuit 212. For example, a nonlinear device with a response that matches a logarithmic or other type of load voltage versus limiting current curve could be used in lieu of the opamp 144. The D1 diode 146 could also be replaced with a more precise reference voltage device.

In summary, the present invention (as embodied herein and as claimed below) is generally directed to a protection circuit (such as 200, 220, 240) for a power switching device (such as 122, 242). The switching device 122, 242 preferably includes respective source, drain and gate terminals (such as 124, 126, 128) and is configured to supply current to a load (such as 130) from a voltage source (such as 132) along a source-to-drain path in relation to an input signal provided to the gate terminal.

The protection circuit includes a voltage drop sensing circuit (such as 210, 222, 244) connected in parallel with the switching device to sense a voltage drop across the switching device. The protection circuit further includes a limit circuit (such as 212, 246) connected to the voltage drop sensing circuit which operates to inhibit further flow of load current through the switching device in relation to the sensed voltage drop. The limit circuit limits the load current to different maximum values for different sensed voltage drop values. This enables the load current to be limited to a lower value in the event an electrical short occurs across the load, reducing the amount of power dissipated by the switching device.

Preferably, the switching device comprises a power FET. However, the use of the terms source, drain and gate terminals in the appended claims will be understood to be in a generic sense; that is, the source describes a terminal which receives the load current, the drain describes a terminal which outputs the load current, and the gate describes a terminal which modulates the flow of current from source to drain. Accordingly, any number of other types of switching devices, including but not limited to bipolar devices, will be understood as being included within these terms.

For purposes of the appended claims, the recited function of the "first means" will be understood to be carried out by the respective protection circuits of FIGS. 3–5. The related art circuit of FIG. 2 fails to carry out the recited function and is hence expressly excluded from the scope of the recited "first means."

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application of the protection circuit without departing from the spirit and scope of the present invention.

In addition, although the embodiments described herein are generally directed to a protection circuit used in a disc drive data storage device, it will be appreciated by those skilled in the art that the power supply can be used in various other types of electrical systems without departing from the spirit and scope of the claimed invention.

What is claimed is:

1. A protection circuit comprising:
   a voltage drop sensing circuit configured to sense a voltage drop across a switching device in relation to a flow of current through the switching device; and
   a limit circuit configured to inhibit further flow of the current through the switching device in relation to the sensed voltage drop, wherein the limit circuit limits the current to different maximum values for different sensed voltage drop values.

2. The protection circuit of claim 1, wherein the switching device comprises respective source, drain and gate terminals, wherein the voltage drop sensing circuit comprises serially connected first and second resistors which are in turn connected in parallel with the source and drain terminals of the switching device, wherein the first and second resistors define a sense node therebetween, and wherein the sensed voltage drop is sensed in relation to a voltage established at the sense node.

3. The protection circuit of claim 2, wherein the first and second resistors of the voltage drop sensing circuit each are provided with respective, opposing first and second terminals, wherein the first terminal of the first resistor is connected to the source terminal of the switching device, and wherein the second terminal of the first resistor is connected to the first terminal of the second resistor to define the sense node.

4. The protection circuit of claim 2, wherein the voltage drop sensing circuit further comprises a diode coupled to the first and second resistors.

5. The protection circuit of claim 1, wherein the limit circuit comprises an operational amplifier having respective positive and negative input terminals and an output terminal, wherein a selected one of the positive and negative input terminals is coupled to the voltage drop sensing circuit to receive the sensed voltage drop, wherein the remaining one of the positive and negative input terminals is coupled to a reference voltage source to receive a reference voltage, and wherein the output terminal is coupled to a gate terminal of the switching device so that the operational amplifier changes a voltage level at the gate terminal to alter a conductivity of the switching device along a source-to-drain path of the switching device in relation to a magnitude of the sensed voltage drop with respect to a magnitude of the reference voltage.

6. The protection circuit of claim 1, wherein the switching device comprises a power field effect transistor (FET).

7. The protection circuit of claim 1, wherein the current is supplied to an electrical load in a disc drive data storage device.

8. A circuit, comprising:
a switching device configured to supply load current to a load from a voltage source; and
first means for sensing a voltage drop across the switching device and for inhibiting passage of further load current through the switching device in relation to the voltage drop, wherein the load current is limited to different maximum values for different sensed voltage drop values.

9. The circuit of claim 8, wherein the first means comprises:
a voltage drop sensing circuit connected in parallel with the switching device to sense a source-to-drain voltage drop across the switching device; and
a limit circuit connected to the voltage drop sensing circuit which inhibits the further flow of the load current through the switching device in relation to the sensed source-to-drain voltage drop.

10. The circuit of claim 9, wherein the voltage drop sensing circuit comprises first and second resistors each provided with respective, opposing first and second terminals, wherein the first terminal of the first resistor is connected to the source terminal of the switching device, and wherein the second terminal of the first resistor is connected to the first terminal of the second resistor to define the sense node.

11. The circuit of claim 10, wherein the voltage drop sensing circuit further comprises an operational amplifier serially connected with the first and second resistors, wherein the operational amplifier has respective positive and negative input terminals and an output terminal, and wherein at least a selected one of the positive input terminal, the negative input terminal and the output terminal is connected to the drain terminal of the switching device.

12. The circuit of claim 11, wherein the limit circuit comprises an operational amplifier having respective positive and negative input terminals and an output terminal, wherein a selected one of the positive and negative input terminals is coupled to the voltage drop sensing circuit to receive the sensed source-to-drain voltage drop, wherein the remaining one of the positive and negative input terminals is coupled to a reference voltage source to receive a reference voltage, and wherein the output terminal is coupled to the gate terminal of the switching device so that the operational amplifier changes a voltage level at the gate terminal to alter a conductivity of the switching device along the source-to-drain path in relation to a magnitude of the sensed source-to-drain voltage drop with respect to a magnitude of the reference voltage.

13. The circuit of claim 8, wherein the switching device comprises a power field effect transistor (FET).

14. The circuit of claim 8, wherein the load comprises an electrical load iii a disc drive data storage device.

15. An apparatus comprising:
an electrical load;
a switching device connected between the electrical load and a voltage source to supply load current to the load; and
a switching device protection circuit which senses a voltage drop across the switching device and inhibits passage of further load current in relation to the sensed voltage drop, wherein the protection circuit limits said load current to different maximum values for different sensed voltage drop values.

16. The apparatus of claim 15, wherein the switching device comprises respective source, drain and gate terminals, wherein the voltage drop sensing circuit comprises serially connected first and second resistors which are in turn connected in parallel with the source and drain terminals of the switching device, wherein the first and second resistors define a sense node therebetween, and wherein the sensed voltage drop is sensed in relation to a voltage established at the sense node.

17. The apparatus of claim 15, wherein the voltage drop sensing circuit further comprises an operational amplifier serially connected with the first and second resistors, wherein the operational amplifier has respective positive and negative input terminals and an output terminal, and wherein at least a selected one of the positive input terminal, the negative input terminal and the output terminal is connected to the switching device.

18. The apparatus of claim 15, wherein the limit circuit comprises an operational amplifier having respective positive and negative input terminals and an output terminal, wherein a selected one of the positive and negative input terminals is coupled to the voltage drop sensing circuit to receive the sensed voltage drop, wherein the remaining one of the positive and negative input terminals is coupled to a reference voltage source to receive a reference voltage, and wherein the output terminal is coupled to a gate terminal of the switching device so that the operational amplifier changes a voltage level at the gate terminal to alter a conductivity of the switching device along a source-to-drain path of the switching device in relation to a magnitude of the sensed voltage drop with respect to a magnitude of the reference voltage.

19. The apparatus of claim 15, wherein the switching device comprises a power field effect transistor (FET).

20. The apparatus of claim 15 wherein the electrical load comprises a rotatable motor.

* * * * *